United States Patent
Chai et al.

(10) Patent No.: US 9,201,106 B1
(45) Date of Patent: *Dec. 1, 2015

(54) SELF SHIELDING CAPACITANCE SENSING PANEL

(71) Applicant: Parade Technologies, Ltd., Santa Clara, CA (US)

(72) Inventors: Min Chin Chai, Lynnwood, WA (US); Fred Keiser, San Jose, CA (US); Igor Polishchuk, Fremont, CA (US)

(73) Assignee: PARADE TECHNOLOGIES, LTD., Santa Clara, CA (US)

(*) Notice: Subject to any disclaimer, the term of this patent is extended or adjusted under 35 U.S.C. 154(b) by 165 days.

This patent is subject to a terminal disclaimer.

(21) Appl. No.: 13/923,037

(22) Filed: Jun. 20, 2013

Related U.S. Application Data

(63) Continuation of application No. 13/172,749, filed on Jun. 29, 2011, now Pat. No. 8,482,546.

(60) Provisional application No. 61/478,346, filed on Apr. 22, 2011, provisional application No. 61/360,305, filed on Jun. 30, 2010.

(51) Int. Cl.
*G06F 3/045* (2006.01)
*G01R 27/26* (2006.01)
*G06F 3/044* (2006.01)

(52) U.S. Cl.
CPC ............ *G01R 27/2605* (2013.01); *G06F 3/044* (2013.01)

(58) Field of Classification Search
CPC ....... G06F 3/044; G06F 3/045; G06F 3/0488; G06F 2203/0411
See application file for complete search history.

(56) References Cited

U.S. PATENT DOCUMENTS

| | | | |
|---|---|---|---|
| 6,627,154 B1 | 9/2003 | Goodman et al. |
| 7,663,607 B2 | 2/2010 | Hotelling et al. |
| 7,920,129 B2 | 4/2011 | Hotelling et al. |
| 7,940,251 B2 | 5/2011 | Hashida |
| 7,965,281 B2 | 6/2011 | Mackey |
| 8,217,916 B2 | 7/2012 | Anno |
| 8,410,795 B1 | 4/2013 | Peng et al. |
| 2002/0015024 A1 | 2/2002 | Westerman et al. |
| 2002/0098119 A1 | 7/2002 | Goodman |
| 2007/0139395 A1 | 6/2007 | Westerman et al. |
| 2008/0225015 A1 | 9/2008 | Hashida |
| 2009/0051863 A1 | 2/2009 | Meisner |
| 2009/0159344 A1 | 6/2009 | Hotelling et al. |
| 2010/0044122 A1 | 2/2010 | Sleeman et al. |
| 2010/0045632 A1 | 2/2010 | Yilmaz et al. |

(Continued)

OTHER PUBLICATIONS

U.S. Appl. No. 13/172,749: "Self Shielding Capacitance Sensing Panel" Min Chin Chai et al., filed Jun. 29, 2011; 43 pages.

(Continued)

*Primary Examiner* — Joe H Cheng

(74) *Attorney, Agent, or Firm* — Morgan, Lewis & Bockius LLP

(57) ABSTRACT

A self-shielding capacitive sensor array may include a first plurality of sensor elements and a second plurality of sensor elements, where each of the second plurality of sensor elements intersects each of the first plurality of sensor elements, such that each of the first plurality of sensor elements may be capacitively coupled with each of the second plurality of sensor elements. The first plurality of sensor elements may be configured to shield each of the second plurality of sensor elements from a noise source.

20 Claims, 9 Drawing Sheets

(56) References Cited

U.S. PATENT DOCUMENTS

| | | |
|---|---|---|
| 2010/0059294 A1 | 3/2010 | Elias et al. |
| 2010/0060300 A1* | 3/2010 | Muller et al. ................ 324/686 |
| 2010/0182275 A1 | 7/2010 | Saitou |
| 2010/0224424 A1 | 9/2010 | Kasajima |
| 2010/0292945 A1 | 11/2010 | Reynolds et al. |
| 2010/0302206 A1 | 12/2010 | Yu et al. |
| 2010/0328255 A1 | 12/2010 | Ishizaki et al. |
| 2011/0134073 A1* | 6/2011 | Ahn .............................. 345/174 |
| 2011/0261003 A1 | 10/2011 | Lee et al. |
| 2011/0316567 A1 | 12/2011 | Chai et al. |
| 2012/0044193 A1 | 2/2012 | Peng et al. |
| 2012/0044198 A1 | 2/2012 | Chai et al. |
| 2012/0133611 A1 | 5/2012 | Chai et al. |
| 2012/0229417 A1 | 9/2012 | Badaye |
| 2013/0169582 A1 | 7/2013 | Ryshtun |

OTHER PUBLICATIONS

U.S. Appl. No. 13/247,867: "Two Prong Capacitive Sensor Pattern," Massoud Badaye, filed Sep. 28, 2011; 51 pages.

International Search Report for International Application No. PCT/US11/66509 dated Apr. 19, 2012; 2 pages.

USPTO Notice of Allowance for U.S. Appl. No. 13/172,749 dated Mar. 19, 2013; 10 pages.

USPTO Notice of Allowance for U.S. Appl. No. 13/172,749 dated May 9, 2013; 6 pages.

USPTO Notice of Allowance for U.S. Appl. No. 13/247,867 dated Oct. 21, 2013; 10 pages.

USPTO Notice of Allowance for U.S. Appl. No. 13/247,867 dated Dec. 6, 2013; 10 pages.

Written Opinion of the International Searching Authority for International Application No. PCT/US11/66509 mailed Apr. 19, 2012; 6 pages.

* cited by examiner

SELF SHIELDING CAPACITANCE SENSING PANEL

RELATED APPLICATIONS

This application is a continuation of U.S. application Ser. No. 13/172,749, filed Jun. 29, 2011, which claims priority to U.S. Provisional Patent Application No. 61/478,346, filed Apr. 22, 2011, and U.S. Provisional Patent Application No. 61/360,305, filed Jun. 30, 2010 all of which are incorporated by reference herein in their entirety.

TECHNICAL FIELD

This disclosure relates to the field of capacitive sensors and, in particular, to a self-shielding capacitive sensing panel.

BACKGROUND

Computing devices, such as notebook computers, personal data assistants (PDAs), kiosks, and mobile handsets, have user interface devices, which are also known as human interface devices (HID). One user interface device that has become more common is a touch-sensor pad (also commonly referred to as a touchpad). A basic notebook computer touch-sensor pad emulates the function of a personal computer (PC) mouse. A touch-sensor pad is typically embedded into a PC notebook for built-in portability. A touch-sensor pad replicates mouse X/Y movement by using two defined axes which contain a collection of sensor elements that detect the position of one or more conductive objects, such as a finger. Mouse right/left button clicks can be replicated by two mechanical buttons, located in the vicinity of the touchpad, or by tapping commands on the touch-sensor pad itself. The touch-sensor pad provides a user interface device for performing such functions as positioning a pointer, or selecting an item on a display. These touch-sensor pads may include multi-dimensional sensor arrays for detecting movement in multiple axes. The sensor array may include a one-dimensional sensor array, detecting movement in one axis. The sensor array may also be two dimensional, detecting movements in two axes.

Another user interface device that has become more common is a touch screen. Touch screens, also known as touchscreens, touch windows, touch panels, or touchscreen panels, are transparent display overlays which are typically either pressure-sensitive (resistive or piezoelectric), electrically-sensitive (capacitive), acoustically-sensitive (surface acoustic wave (SAW)) or photo-sensitive (infra-red). The effect of such overlays allows a display to be used as an input device, removing the keyboard and/or the mouse as the primary input device for interacting with the display's content. Such displays can be attached to computers or, as terminals, to networks. Touch screens have become familiar in retail settings, on point-of-sale systems, on ATMs, on mobile handsets, on kiosks, on game consoles, and on PDAs where a stylus is sometimes used to manipulate the graphical user interface (GUI) and to enter data. A user can touch a touch screen or a touch-sensor pad to manipulate data. For example, a user can apply a single touch, by using a finger to touch the surface of a touch screen, to select an item from a menu.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in a simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment, a self-shielding capacitive sensor including a plurality of sensor elements may be used with both mutual capacitance and self capacitance sensing methods. One embodiment of such a capacitive sensor may include a first plurality of sensor elements and a second plurality of sensor elements intersecting the first plurality of sensor elements. These may be, for example, row and column sensor elements, where each row sensor element is capacitively coupled with each column sensor element. In one embodiment, the row sensor elements are used to transmit a signal that is measured at the column sensor elements to detect changes in capacitance at each intersection between the row and column sensor elements. In one embodiment, one set of sensor elements may be used to shield the other set of sensor elements from a noise source. For example, the row sensor elements, which may be the transmit sensor elements, may be used to shield the column (receive) sensor elements from a noise source, such as a liquid crystal display (LCD), another type of display, or other circuitry. In one embodiment, the shielding sensor elements may be situated in between the noise source and the other set of sensor elements, and may be wider or may cover more area such that substantially all the area of the other set of sensor elements is shielded from the noise source.

Figure 1:
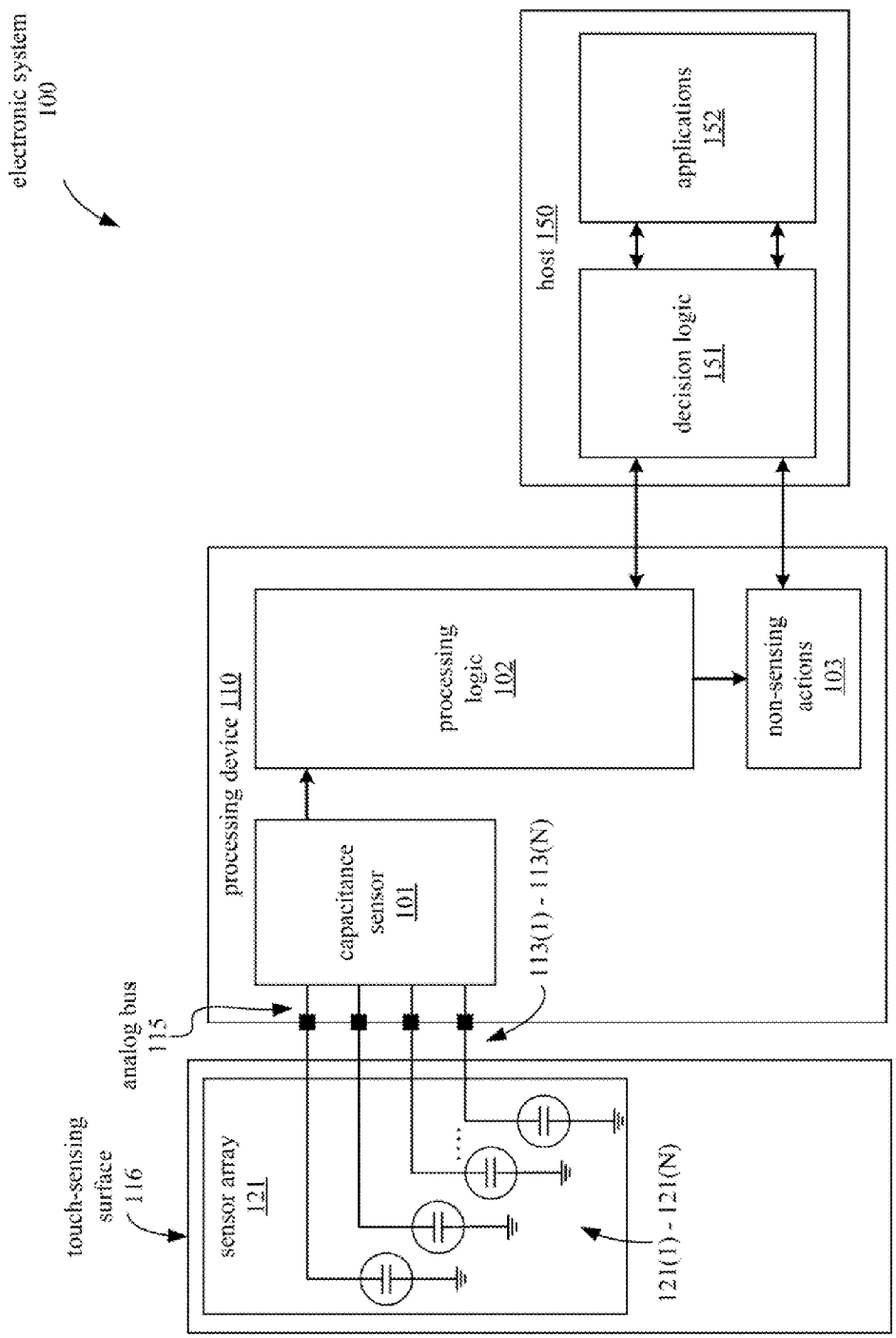
FIG. 1 is a block diagram illustrating an embodiment of an electronic system that processes touch sensor data.

FIG. 1 illustrates a block diagram of one embodiment of an electronic system 100 including a processing device 110 that may be configured to measure capacitances from a self-shielding capacitive sensor. The electronic system 100 includes a touch-sensing surface 116 (e.g., a touchscreen, or a touch pad) coupled to the processing device 110 and a host 150. In one embodiment, the touch-sensing surface 116 is a two-dimensional user interface that uses a sensor array 121 to detect touches on the surface 116.

In one embodiment, the sensor array 121 includes sensor elements 121(1)-121(N) (where N is a positive integer) that are disposed as a two-dimensional matrix (also referred to as an XY matrix). The sensor array 121 is coupled to pins 113(1)-113(N) of the processing device 110 via one or more analog buses 115 transporting multiple signals. In this embodiment, each sensor element 121(1)-121(N) is represented as a capacitor. The self capacitance of each sensor in the sensor array 121 is measured by a capacitance sensor 101 in the processing device 110.

In one embodiment, the capacitance sensor 101 may include a relaxation oscillator or other means to convert a capacitance into a measured value. The capacitance sensor 101 may also include a counter or timer to measure the oscillator output. The capacitance sensor 101 may further include software components to convert the count value (e.g., capacitance value) into a sensor element detection decision (also referred to as switch detection decision) or relative magnitude. It should be noted that there are various known methods for measuring capacitance, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms. It should be noted however, instead of evaluating the raw counts relative to a threshold, the capacitance sensor 101 may be evaluating other measurements to determine the user interaction. For example, in the capacitance sensor 101 having a sigma-delta modulator, the capacitance sensor 101 is evaluating the ratio of pulse widths of the output, instead of the raw counts being over or under a certain threshold.

In one embodiment, the processing device 110 further includes processing logic 102. Operations of the processing logic 102 may be implemented in firmware; alternatively, it may be implemented in hardware or software. The processing logic 102 may receive signals from the capacitance sensor 101, and determine the state of the sensor array 121, such as whether an object (e.g., a finger) is detected on or in proximity to the sensor array 121 (e.g., determining the presence of the object), where the object is detected on the sensor array (e.g., determining the location of the object), tracking the motion of the object, or other information related to an object detected at the touch sensor.

In another embodiment, instead of performing the operations of the processing logic 102 in the processing device 110, the processing device 110 may send the raw data or partially-processed data to the host 150. The host 150, as illustrated in FIG. 1, may include decision logic 151 that performs some or all of the operations of the processing logic 102. Operations of the decision logic 151 may be implemented in firmware, hardware, software, or a combination thereof. The host 150 may include a high-level Application Programming Interface (API) in applications 152 that perform routines on the received data, such as compensating for sensitivity differences, other compensation algorithms, baseline update routines, start-up and/or initialization routines, interpolation operations, or scaling operations. The operations described with respect to the processing logic 102 may be implemented in the decision logic 151, the applications 152, or in other hardware, software, and/or firmware external to the processing device 110. In some other embodiments, the processing device 110 is the host 150.

In another embodiment, the processing device 110 may also include a non-sensing actions block 103. This block 103 may be used to process and/or receive/transmit data to and from the host 150. For example, additional components may be implemented to operate with the processing device 110 along with the sensor array 121 (e.g., keyboard, keypad, mouse, trackball, LEDs, displays, or other peripheral devices).

The processing device 110 may reside on a common carrier substrate such as, for example, an integrated circuit (IC) die substrate, or a multi-chip module substrate. Alternatively, the components of the processing device 110 may be one or more separate integrated circuits and/or discrete components. In one embodiment, the processing device 110 may be the Programmable System on a Chip (PSoC™) processing device, developed by Cypress Semiconductor Corporation, San Jose, Calif. Alternatively, the processing device 110 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or other programmable device. In an alternative embodiment, for example, the processing device 110 may be a network processor having multiple processors including a core unit and multiple micro-engines. Additionally, the processing device 110 may include any combination of general-purpose processing device(s) and special-purpose processing device(s).

In one embodiment, the electronic system 100 is implemented in a device that includes the touch-sensing surface 116 as the user interface, such as handheld electronics, portable telephones, cellular telephones, notebook computers, personal computers, personal data assistants (PDAs), kiosks, keyboards, televisions, remote controls, monitors, handheld multi-media devices, handheld video players, gaming devices, control panels of a household or industrial appliances, or other computer peripheral or input devices. Alternatively, the electronic system 100 may be used in other types of devices. It should be noted that the components of electronic system 100 may include all the components described above. Alternatively, electronic system 100 may include only some of the components described above, or include additional components not listed herein.

Figure 2:
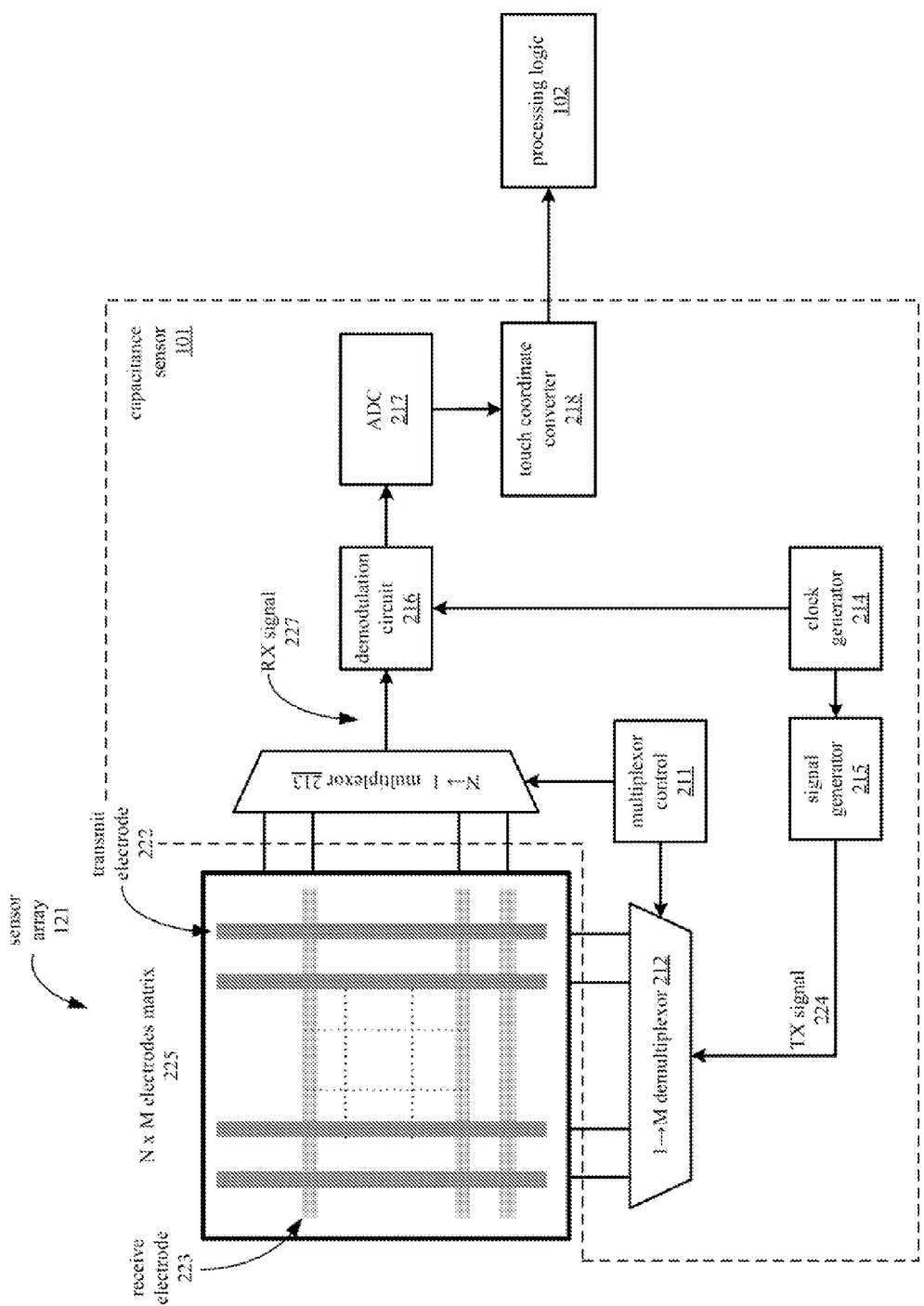
FIG. 2 is a block diagram illustrating an embodiment of an electronic system that processes touch sensor data.

FIG. 2 is a block diagram illustrating one embodiment of a capacitive touch sensor array 121 and a capacitance sensor 101 that converts measured capacitances to coordinates. The coordinates are calculated based on measured capacitances. In one embodiment, sensor array 121 and capacitance sensor 101 are implemented in a system such as electronic system 100. Sensor array 121 includes a matrix 225 of N×M electrodes (N receive electrodes and M transmit electrodes), which further includes transmit (TX) electrode 222 and receive (RX) electrode 223. Each of the electrodes in matrix 225 is connected with capacitance sensing circuit 201 through demultiplexer 212 and multiplexer 213.

Capacitance sensor 101 includes multiplexer control 211, demultiplexer 212 and multiplexer 213, clock generator 214, signal generator 215, demodulation circuit 216, and analog to digital converter (ADC) 217. ADC 217 is further coupled with touch coordinate converter 218. Touch coordinate converter 218 outputs a signal to the processing logic 102.

The transmit and receive electrodes in the electrode matrix 225 may be arranged so that each of the transmit electrodes overlap and cross each of the receive electrodes such as to form an array of intersections, while maintaining galvanic isolation from each other. Thus, each transmit electrode may be capacitively coupled with each of the receive electrodes. For example, transmit electrode 222 is capacitively coupled with receive electrode 223 at the point where transmit electrode 222 and receive electrode 223 overlap.

Clock generator 214 supplies a clock signal to signal generator 215, which produces a TX signal 224 to be supplied to the transmit electrodes of touch sensor 121. In one embodiment, the signal generator 215 includes a set of switches that operate according to the clock signal from clock generator 214. The switches may generate a TX signal 224 by periodically connecting the output of signal generator 215 to a first voltage and then to a second voltage, wherein said first and second voltages are different.

The output of signal generator 215 is connected with demultiplexer 212, which allows the TX signal 224 to be applied to any of the M transmit electrodes of touch sensor 121. In one embodiment, multiplexer control 211 controls demultiplexer 212 so that the TX signal 224 is applied to each transmit electrode 222 in a controlled sequence. Demultiplexer 212 may also be used to ground, float, or connect an alternate signal to the other transmit electrodes to which the TX signal 224 is not currently being applied.

Because of the capacitive coupling between the transmit and receive electrodes, the TX signal 224 applied to each transmit electrode induces a current within each of the receive electrodes. For instance, when the TX signal 224 is applied to transmit electrode 222 through demultiplexer 212, the TX signal 224 induces an RX signal 227 on the receive electrodes in matrix 225. The RX signal 227 on each of the receive electrodes can then be measured in sequence by using multiplexer 213 to connect each of the N receive electrodes to demodulation circuit 216 in sequence.

The mutual capacitance associated with each intersection between a TX electrode and an RX electrode can be sensed by selecting every available combination of TX electrode and an RX electrode using demultiplexer 212 and multiplexer 213. To improve performance, multiplexer 213 may also be segmented to allow more than one of the receive electrodes in matrix 225 to be routed to additional demodulation circuits 216. In an optimized configuration, wherein there is a 1-to-1 correspondence of instances of demodulation circuit 216 with receive electrodes, multiplexer 213 may not be present in the system.

When an object, such as a finger, approaches the electrode matrix 225, the object causes a decrease in the mutual capacitance between only some of the electrodes. For example, if a finger is placed near the intersection of transmit electrode 222 and receive electrode 223, the presence of the finger will decrease the mutual capacitance between electrodes 222 and 223. Thus, the location of the finger on the touchpad can be determined by identifying the one or more receive electrodes having a decreased mutual capacitance in addition to identifying the transmit electrode to which the TX signal 224 was applied at the time the decreased mutual capacitance was measured on the one or more receive electrodes.

By determining the mutual capacitances associated with each intersection of electrodes in the matrix 225, the locations of one or more touch contacts may be determined. The determination may be sequential, in parallel, or may occur more frequently at commonly used electrodes.

In alternative embodiments, other methods for detecting the presence of a finger or conductive object may be used where the finger or conductive object causes an increase in capacitance at one or more electrodes, which may be arranged in a grid or other pattern. For example, a finger placed near an electrode of a capacitive sensor may introduce an additional capacitance to ground that increases the total capacitance between the electrode and ground. The location of the finger can be determined from the locations of one or more electrodes at which an increased capacitance is detected.

The induced current signal 227 is rectified by demodulation circuit 216. The rectified current output by demodulation circuit 216 can then be filtered and converted to a digital code by ADC 217.

The digital code is converted to touch coordinates indicating a position of an input on touch sensor array 121 by touch coordinate converter 218. The touch coordinates are transmitted as an input signal to the processing logic 102. In one embodiment, the input signal is received at an input to the processing logic 102. In one embodiment, the input may be configured to receive capacitance measurements indicating a plurality of row coordinates and a plurality of column coordinates. Alternatively, the input may be configured to receive row coordinates and column coordinates.

In one embodiment, the sensor array 121 can be configured to detect multiple touches. One technique for multi-touch detection uses a two-axis implementation: one axis to support rows and another axis to support columns. Additional axes, such as a diagonal axis, implemented on the surface using additional layers, can allow resolution of additional touches.

Figure 3A:
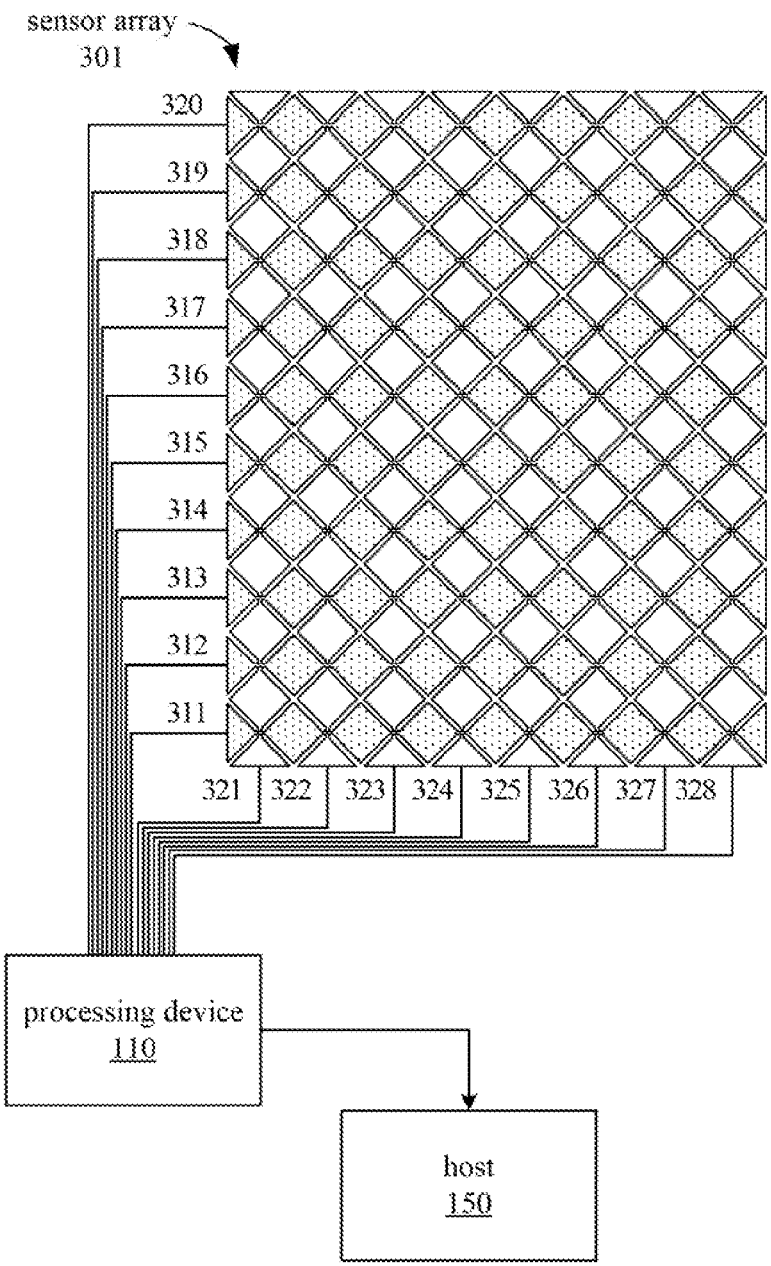
FIG. 3A illustrates an embodiment of a capacitive sensor array.

FIG. 3A illustrates one embodiment of a capacitive touch sensor array 301, which has a plurality of row sensor elements 311-320 intersecting with a plurality of column sensor element 321-328. These row and column sensor elements are connected to processing device 110, which is further connected to host 150.

The diamond pattern of sensor array 301 may be used according to a self-capacitance measurement method to detect coupling capacitance between a conductive object, such as a finger, and any of the row or column sensor elements.

When a sensor array 301 having a diamond pattern is used with a mutual capacitance method, a large coupling of finger capacitance to the receiving (RX) electrodes may cause signal disparity, resulting in loss of sensitivity when the system is poorly grounded and measurement inaccuracies. Furthermore, the diamond pattern of sensor array 301 may also expose the RX sensor elements to direct noise coupling. For example, if the sensor array 301 is used as part of a touchscreen, the sensor array 301 may be made from a transparent material overlaying a noise source such as an LCD or other type of display. In this arrangement, the RX sensor elements may be susceptible to noise from the display that may affect the capacitance measurements.

In one embodiment, false touches or other measurement inaccuracies may result from mechanical stress that causes bending of the sensor array. For example, in a touch screen system having a gap between the touch sensor and a LCD panel, mechanical stress can cause the sensor baseline to change, and the change in sensor baseline may be interpreted as a false touch or a shift in finger coordinates.

Figure 3B:
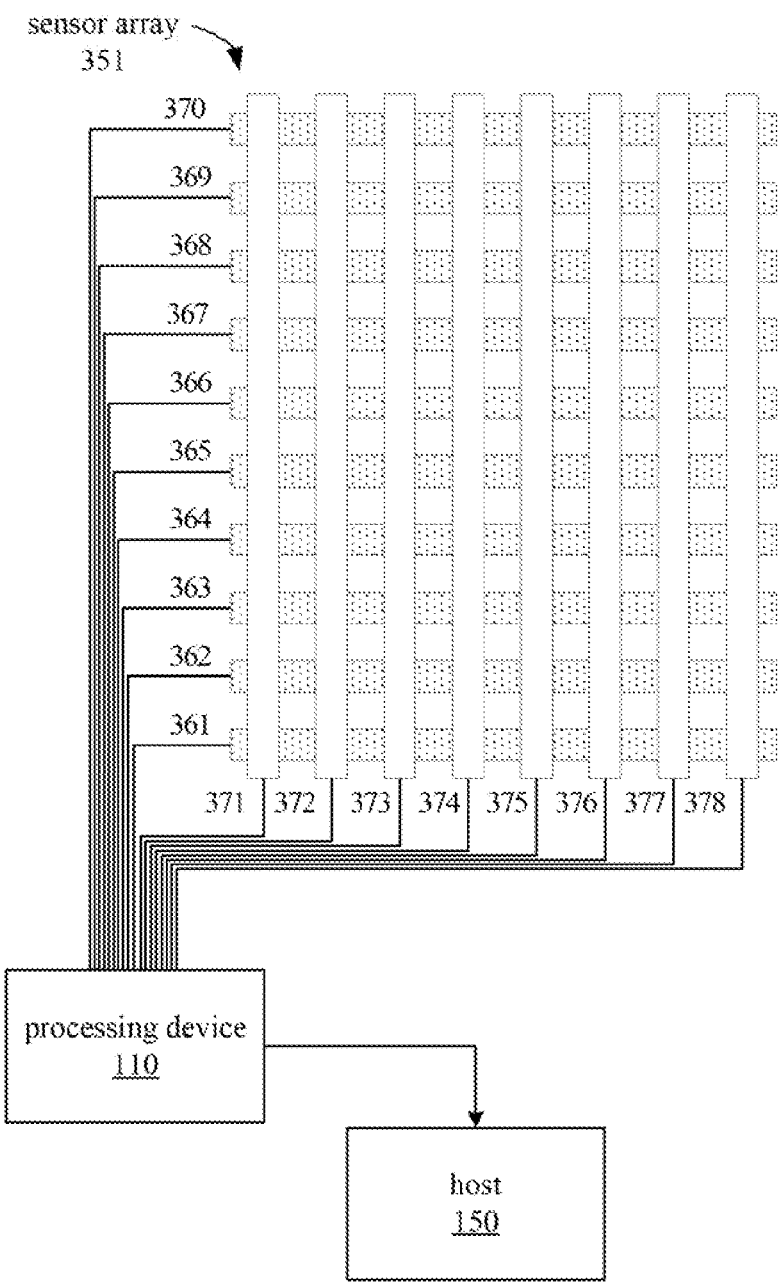
FIG. 3B illustrates an embodiment of a capacitive sensor array.

FIG. 3B illustrates a sensor array 351 having a single crossbar pattern. Sensor array 351 includes transmit (TX) sensor elements 361-370 and receive (RX) sensor elements 371-378. In one embodiment, a sensor array 351 having a single crossbar pattern may suffer from poor water rejection characteristics due to direct coupling between the TX sensors to water or other liquids on the surface of the sensor array 351. A capacitive sensing system with poor water rejection characteristics may be more likely to register water or other liquids on the surface on the sensor array as a false touch. When used in self-capacitance measurement mode, the single crossbar pattern may also have a reduced signal, as compared to other patterns.

Figure 4A:
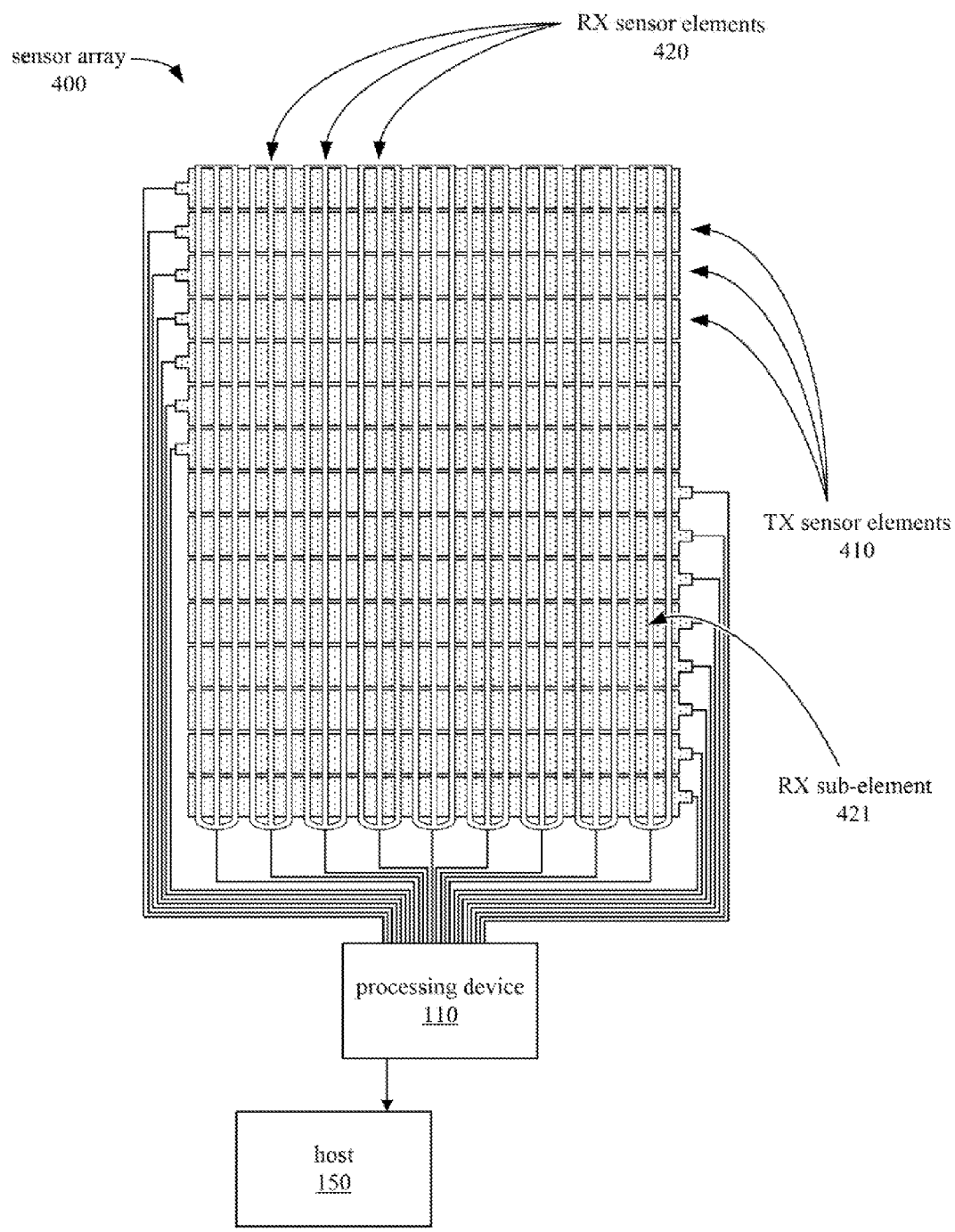
FIG. 4A illustrates an embodiment of a self-shielding capacitive sensor array.

FIG. 4A illustrates a self-shielding sensor array 400, according to one embodiment. Sensor array 400 includes a plurality of row sensor elements 410 and a plurality of column sensor elements that are connected to a processing device 110. Processing device 110 is connected to a host 150. In one embodiment, the row sensor elements 410 are transmit (TX) sensor elements and the row sensor elements 420 are receive (RX) sensor elements, and processing device 110 measures a mutual capacitance for each intersection between one of the row sensor elements 410 and column sensor elements 420 by applying a TX signal to at least one of the row sensor elements 410 and measuring a RX signal received by at least one of the column sensor elements 420.

In one embodiment, the RX sensor elements 420 are situated above the wider TX sensor elements 410. In one embodiment, the wide TX sensor elements 410 cover substantially all of the area of the sensor array 400, such that substantially all of the area of the sensor elements 420 overlaps some portion of one of the sensor elements 420, except for small areas in between or at the edges of the sensor elements 410.

As illustrated in FIG. 4A, each of the RX sensor elements 420 includes three parallel sub-elements (such as RX sub-element 421) that are electrically connected to each other. Although three sub-elements are pictured for each RX sensor element, the number of sub-elements is not limited to three, but may be more or fewer than three.

The multiple RX sub-elements increase the fringe electric field between the TX and RX sensor elements. Since mutual capacitance sensing methods operate by detecting modulation of the fringe electric field by a conductive object, the multiple RX sub-elements maximize the detectable change in mutual capacitance to achieve a high signal to noise ratio.

In one embodiment, the capacitive coupling between the finger or other conductive object proximate to the sensor array 400 may be reduced (as compared to the diamond pattern) because of the smaller surface area of the RX sensor elements 420. This also helps to achieve a high signal to noise ratio.

In one embodiment, the division of the RX sensor elements 420 into multiple sub-elements can also improve the water rejection characteristics of the sensor array and improve edge accuracy. The number of sub-elements per sensor element and the dimensions of the sub-elements may be optimized to minimize the RC delay (the time delay for the panel to detect a touch, which is affected by the resistance and capacitance of the sensor element) and to maximize the change in mutual capacitance that is caused by a touch or proximity of a conductive object, such as a finger.

Figure 4B:
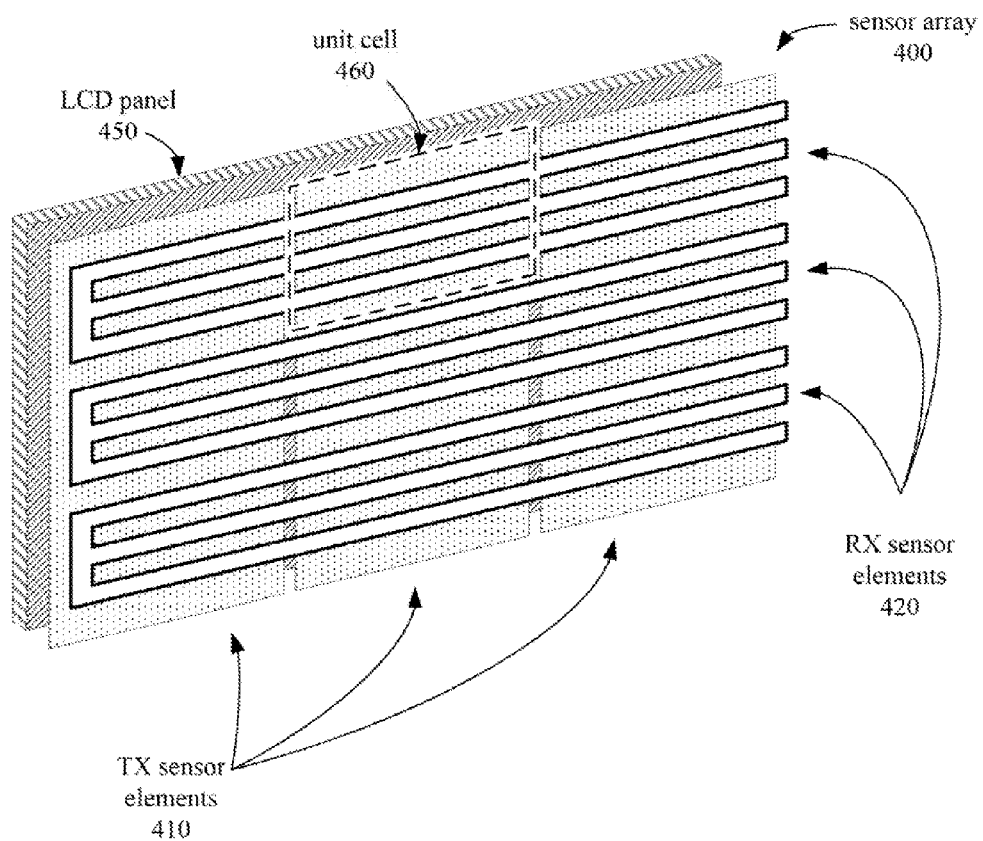
FIG. 4B illustrates an embodiment of a self-shielding capacitive sensor array overlaying a display panel.

FIG. 4B illustrates a portion of a self-shielding capacitive sensor array 400, according to one embodiment. A unit cell 460 of the sensor array 400 delineates the area of the sensor array 400 that corresponds to one intersection between one of the TX sensor elements 410 and one of the RX sensor elements 420.

In one embodiment, the RX sensor elements 420 are shielded from the LCD panel 450 or another noise source by the wider TX sensor elements 410 while the capacitance measurement scan is being performed because the TX sensor elements 410 (except for the TX element that is actively transmitting) are kept at virtual ground during the measurement scan. In one embodiment, the TX sensor elements 410 may be situated between the RX sensor elements 420 and the LCD panel 450 or other noise source to minimize the area of the RX sensor element 420 available for direct coupling with the panel 450 or other noise source. In comparison to other sensor array patterns, such as the diamond pattern of sensor array 301 in FIG. 3A, the self-shielding sensor array 400 reduces the need for a shield layer between the sensor array and a noise source.

In one embodiment, the wider TX sensor elements 410 help maintain a constant parasitic capacitance to the RX sensor elements, thus suppressing baseline changes to the RX electrodes due to mechanical stresses, such as bending of the sensor array 400.

Compared to other sensor array patterns, such as the crossbar pattern of sensor array 351 illustrated in FIG. 3B, the pattern used in the self-shielding sensor array 400 allows for a more balanced coupling between the finger or other conductive object and the TX and RX sensor elements. For example, when a conductive object approaches the sensor array 351, a higher capacitance may be formed between the conductive object and the column sensor elements than between the conductive object and the row sensor elements. In contrast, a conductive object approaching the self-shielding sensor array 400 may form approximately equal capacitances between the conductive object and both the TX and RX sensor elements.

In one embodiment, the width of each sub-element and the number of sub-elements for each of the RX sensor elements 420 may be chosen so that the surface area of each RX sensor element available for direct capacitive coupling with the finger or other conductive object is approximately equal to the surface area of each TX sensor element available for direct capacitive coupling with the finger or conductive object. This balancing may avoid the use of software or firmware algorithms to boost or equalize the row and column signals.

Although the previous figures illustrate TX sensor elements that are arranged as row elements and RX sensor elements arranged as column elements, the TX sensor elements may alternatively be columns and the RX sensor elements may be rows. The arrangement of TX or RX sensor elements as either rows or columns may be independent of the aspect ratio (such as landscape vs. portrait) of the sensor array. Furthermore, in alternative embodiments, the number of sub-elements of each sensor element may be more or less than three, and may not necessarily have equal widths or be evenly spaced apart.

Figure 4C:
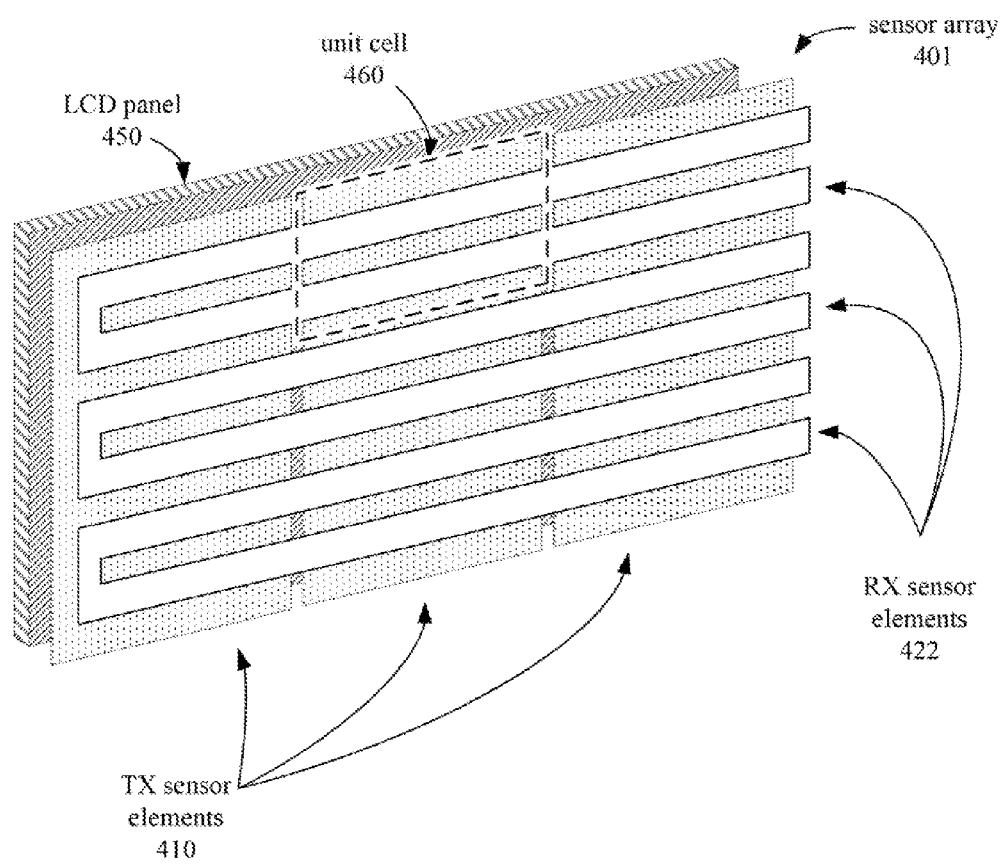
FIG. 4C illustrates an embodiment of a self-shielding capacitive sensor array overlaying a display panel.

For example, FIG. 4C illustrates a portion of a self-shielding capacitive sensor array 401, according to one embodiment. Sensor array 401 is similar to sensor array 400 illustrated in FIG. 4B, except that each of the RX sensor elements 422 of sensor array 401 includes two sub-elements rather than three sub-elements.

Figure 4D:
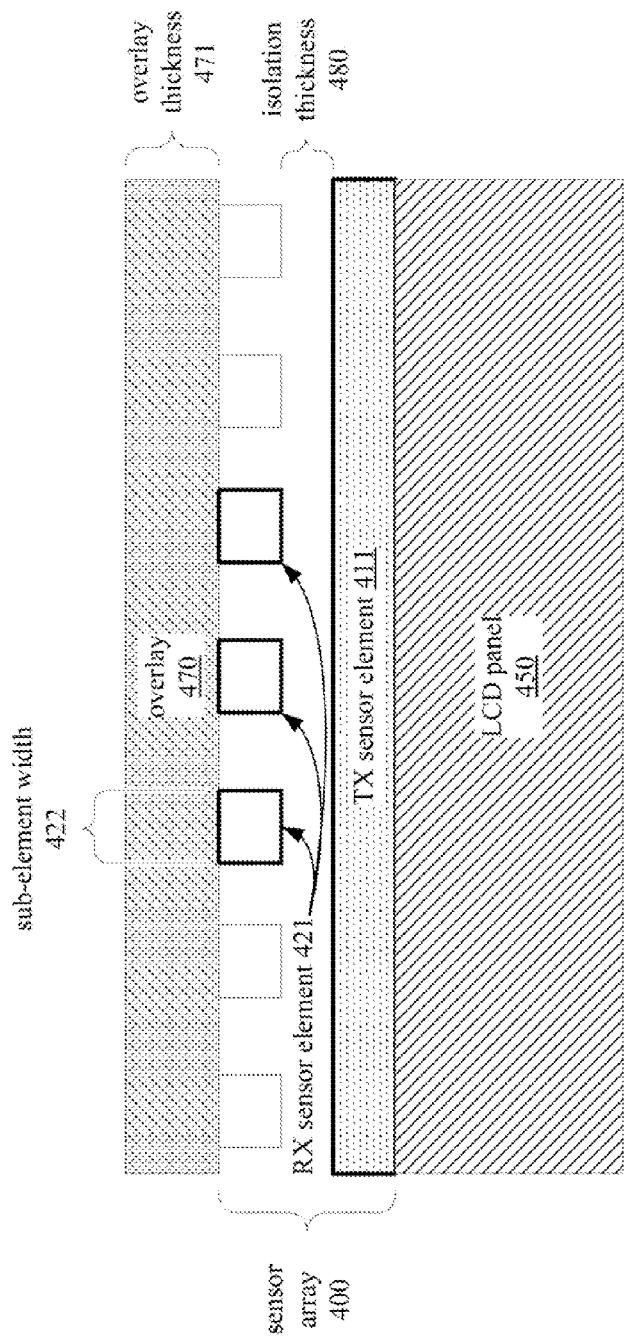
FIG. 4D illustrates an embodiment of a self-shielding capacitive sensor array overlaying a display panel.

FIG. 4D illustrates a self-shielding capacitive sensor array 400 in a cross-sectional view. Sensor array 400 includes RX sensor sub-elements 421 and a TX sensor array 411 separated by an isolation thickness 480. The sensor array 400 is situated above a LCD panel 450 such that the RX sensor sub-elements 421 are shielded by the TX sensor element 411 and other TX sensor elements from noise generated by the LCD panel. In one embodiment, an overlay 470 may be laid above the sensor array 400 to protect the sensor array 400 from wear or corrosion.

In one embodiment, the number of sub-elements 421 of RX sensor element 420 and the width 422 of each sub-element may be optimized based on the isolation thickness 480 and the thickness 471 of the overlay 470. For example, for an overlay thickness of 500 μm (micrometer) and an isolation thickness of 75 μm (micrometer), three sub-elements per RX sensor element may provide the highest signal to noise ratio.

Figure 5:
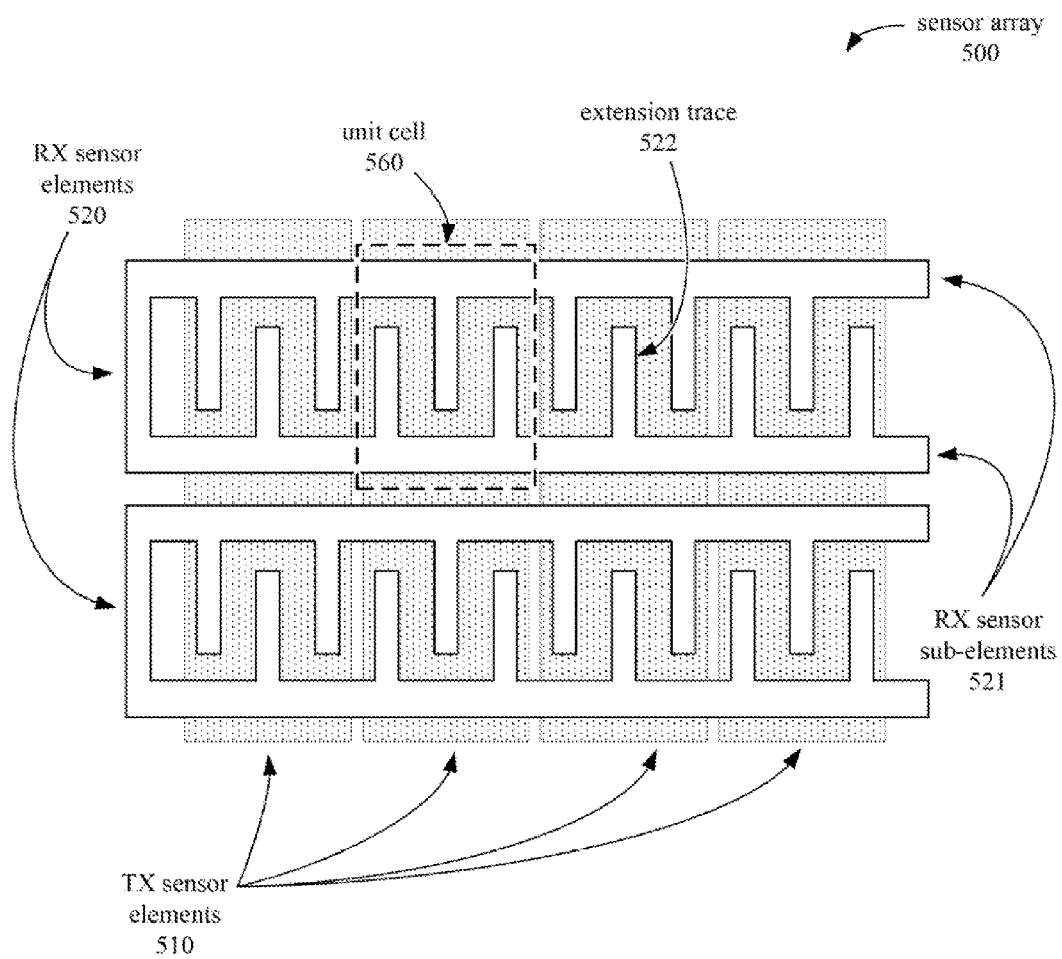
FIG. 5 illustrates an embodiment of a self-shielding capacitive sensor array.

FIG. 5 illustrates a portion of a self-shielding sensor array 500, according to one embodiment. As illustrated in FIG. 5, each of the RX sensor elements 520 of sensor array 500 includes two sub-elements 521. Unit cell 560 delineates an area of the sensor array 500 corresponding to an intersection between one of the RX sensor elements 520 and one of the TX sensor elements 510.

A plurality of extension traces, such as extension trace 522, extends from each of the sub-elements 521. In one embodiment, the extension traces of the sub-elements 521 may be interleaved with each other. In one embodiment, such interleaving may result in denser fringe electric field lines between the TX sensor elements 510 and the RX sensor elements 520.

In one embodiment, the TX and RX sensor elements are not limited to solid lines or stripes. For example, portions of the TX or RX elements may be removed to reduce the amount of overlapping area between the TX and RX sensors. In one embodiment, the portions may be removed to reduce the parasitic capacitance between the TX and RX sensor elements.

In one embodiment, the TX and RX sensor elements can be made from indium tin oxide (ITO) or any other conductive material. In one embodiment, the sub-elements of the RX sensor elements may be replaced with very thin metal traces placed in between LCD pixels to reduce visibility of the sub-elements while still maintaining the benefit of an increased fringe electric field.

In one embodiment, the width of the RX elements at one or more of the edges of a sensor array may be extended to align with the edge of the TX sensor elements for greater linearity and accuracy in the capacitance measurements. In one embodiment, empty space between the sensor elements may be filled in the same plane with dummy areas. Such dummy areas may be added for optical uniformity or to meet a manufacturer's constraints.

In addition to sensor applications, the patterns as illustrated in FIGS. 4A-5 may be used in other designs or applications where a given capacitance density is needed for a given footprint. The number of sub-elements and the width of the sub-elements can be increased or decreased to create a pattern having a specific capacitance density.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus, comprising:
   a first plurality of sensor elements;
   a second plurality of sensor elements, wherein each of the first plurality of sensor elements is capacitively coupled with each of the second plurality of sensor elements, and wherein each of the second plurality of sensor elements comprises a plurality of sub-elements; and
   wherein the first plurality of sensor elements are configured to shield each of the second plurality of sensor elements from a noise source.

2. The apparatus of claim 1, wherein substantially all of an area of the second plurality of sensor elements overlaps an area of the first plurality of sensor elements.

3. The apparatus of claim 1, wherein all of the plurality of sub-elements in each separate sensor element of the second plurality of sensor elements are electrically connected to one another.

4. The apparatus of claim 1, wherein the plurality of sub-elements comprises three parallel sub-elements.

5. The apparatus of claim 1, wherein the plurality of sub-elements comprises two parallel sub-elements.

6. The apparatus of claim 5, wherein each of the two parallel sub-elements comprises one or more extension traces extending from a respective sub-element.

7. The apparatus of claim 6, wherein the one or more extension traces extending from each sub-element are interleaved with each one another.

8. An apparatus, comprising:
   a first plurality of sensor elements separated by a first width between each of the first plurality of sensor elements; and
   a second plurality of sensor elements separated by a second width between each of the second plurality of sensor elements, wherein the first width is less than the second width, wherein each of the second plurality of sensor elements comprises a plurality of sub-elements, and wherein the first plurality of sensor elements is situated between the second plurality of sensor elements and a noise source.

9. The apparatus of claim 8, wherein substantially all of the area of the second plurality of sensor elements overlaps an area of the first plurality of sensor elements.

10. The apparatus of claim 8, wherein each of the first plurality of sensor elements is capacitively coupled to each of the second plurality of sensor elements, wherein each of the first plurality of sensor elements is configured to transmit a signal, and wherein each of the second plurality of sensor elements is configured to receive the transmitted signal.

11. The apparatus of claim 8, wherein the noise source comprises a liquid crystal display (LCD) panel, and wherein the plurality of sub-elements comprise metal traces located between pixels of the LCD panel.

12. The apparatus of claim 8, wherein the plurality of sub-elements comprises three linear parallel sub-elements.

13. The apparatus of claim 8, wherein the plurality of sub-elements comprises two linear parallel sub-elements.

14. The apparatus of claim 13, wherein each of the two linear parallel sub-elements comprises one or more extension traces extending from a respective linear sub-element.

15. The apparatus of claim 14, wherein the one or more extension traces extending from each linear sub-element are interleaved with each one another.

16. An apparatus, comprising:
a first plurality of sensor elements;
a noise source located adjacent to a first side of the plurality of sensor elements;
a second plurality of sensor elements located adjacent to a second side of the first plurality of sensor elements, the first side opposite the second side, wherein noise from the noise source is blocked from the second plurality of sensor elements by the first plurality of sensor elements, and wherein each of the second plurality of sensor elements comprises a plurality of sub-elements; and
a capacitance sensing system coupled with the first plurality of sensor elements and the second plurality of sensor elements, wherein the capacitive sensing system is configured to measure mutual capacitances between each of the first plurality of sensor elements and each of the second plurality of sensor elements.

17. The apparatus of claim 16, wherein the capacitance sensing system is configured to measure the mutual capacitances by applying a transmit signal to each of the first plurality of sensor elements and measuring a receive signal at each of the second plurality of sensor elements.

18. The apparatus of claim 16, wherein the plurality of sub-elements to increase a fringe electric field between the first plurality of sensor elements and the second plurality of sensor elements.

19. The apparatus of claim 16, wherein the plurality of sub-elements comprises parallel sub-elements.

20. The apparatus of claim 19, wherein each of the plurality of parallel sub-elements comprises one or more extension traces extending from a respective sub-element, and wherein the one or more extension traces extending from each sub-element are interleaved with each one another.

* * * * *